United States Patent
Sato

(10) Patent No.: US 8,590,512 B2
(45) Date of Patent: Nov. 26, 2013

(54) MULTI-LAYER PIEZOELECTRIC ELEMENT, METHOD FOR MANUFACTURING THE SAME, INJECTION APPARATUS AND FUEL INJECTION SYSTEM

(75) Inventor: Masahiro Sato, Kirishima (JP)

(73) Assignee: Kyocera Corporation, Kyoto (JP)

( * ) Notice: Subject to any disclaimer, the term of this patent is extended or adjusted under 35 U.S.C. 154(b) by 651 days.

(21) Appl. No.: 12/745,222

(22) PCT Filed: Nov. 27, 2008

(86) PCT No.: PCT/JP2008/071536
§ 371 (c)(1),
(2), (4) Date: Sep. 10, 2010

(87) PCT Pub. No.: WO2009/069694
PCT Pub. Date: Jun. 4, 2009

(65) Prior Publication Data
US 2011/0000466 A1    Jan. 6, 2011

(30) Foreign Application Priority Data

Nov. 28, 2007  (JP) .................................. 2007-307099

(51) Int. Cl.
 *F02D 41/30*    (2006.01)
(52) U.S. Cl.
 USPC .......................................... 123/490; 310/358
(58) Field of Classification Search
 USPC ................. 123/472, 490, 494, 498, 456, 478; 310/358, 363–367; 239/102.2
 See application file for complete search history.

(56) References Cited

U.S. PATENT DOCUMENTS

| | | | | |
|---|---|---|---|---|
| 7,679,272 B2 * | 3/2010 | Okamura et al. | ............. | 310/358 |
| 7,759,847 B2 * | 7/2010 | Okamura et al. | ............. | 310/358 |
| 7,902,726 B2 * | 3/2011 | Okamura et al. | ............. | 310/328 |
| 8,288,921 B2 * | 10/2012 | Terazono et al. | ............. | 310/328 |
| 8,378,554 B2 * | 2/2013 | Nakamura et al. | ............. | 310/328 |
| 8,405,278 B2 * | 3/2013 | Okamura | ............. | 310/328 |
| 8,410,663 B2 * | 4/2013 | Sakamoto et al. | ............. | 310/328 |
| 2007/0205700 A1 | 9/2007 | Okamura et al. | ............. | 310/364 |
| 2008/0303385 A1 * | 12/2008 | Okamura et al. | ............. | 310/366 |

FOREIGN PATENT DOCUMENTS

| | | |
|---|---|---|
| JP | H03256381 A | 11/1991 |
| JP | 2001-094164 | 4/2001 |
| JP | 2005-183553 | 7/2005 |

OTHER PUBLICATIONS

Japanese language office action dated Jul. 2, 2013 and its English language Statement of Relevance of Non-English References Pursuant to 37 CFR 1.98(a)(3)(i) issued in corresponding Japanese application 2009543845.

\* cited by examiner

*Primary Examiner* — Hai Huynh
(74) *Attorney, Agent, or Firm* — DLA Piper LLP (US)

(57) ABSTRACT

A multi-layer piezoelectric element includes a multi-layer structure having a plurality of internal electrode layers and a plurality of piezoelectric ceramic layers. The multi-layer structure has a driving portion formed by stacking the plurality of internal electrode layers and the piezoelectric ceramic layers alternately on each other, and non-driving portions that are formed by stacking a plurality of the piezoelectric ceramic layers and are disposed on both end portions of the driving portion in a stacked direction. The piezoelectric ceramic layers of the non-driving portions have the same piezoelectric material as that of the piezoelectric ceramic layers of the driving portion as a main component, and have a mean crystal grain size larger than that of the driving portion.

4 Claims, 3 Drawing Sheets

MULTI-LAYER PIEZOELECTRIC ELEMENT, METHOD FOR MANUFACTURING THE SAME, INJECTION APPARATUS AND FUEL INJECTION SYSTEM

CROSS-REFERENCE TO RELATED APPLICATIONS

This application is a national stage of international application No. PCT/JP2008/071536, filed on Nov. 27, 2008, and claims the benefit of priority under 35 USC 119 to Japanese Patent Application No. 2007-307099, filed on Nov. 28, 2007, the entire contents of which are incorporated herein by reference.

TECHNICAL FIELD

The present invention relates to a multi-layer piezoelectric element, a method for manufacturing the same, an injection apparatus and a fuel injection system.

BACKGROUND ART

There has hitherto been known a multi-layer piezoelectric element (hereafter sometimes referred to simply as an element) that comprises a multi-layer structure formed by stacking a plurality of piezoelectric material layers via internal electrode layers and a pair of external electrodes formed on side face of the multi-layer structure. The element generally has an opposing portion where the internal electrode layers oppose each other and non-opposing portions positioned on both ends in the stacked direction. When a voltage is applied to the element, the opposing portion undergoes displacement and the non-opposing portions do not undergo displacement, and therefore stress tends to be generated in a region around the interface between these portions. Therefore, there is disclosed an element that is designed for the purpose of reducing the stress generated around the interface by setting the modulus of elasticity of the non-opposing portions to be less than the modulus of elasticity of the opposing portion (Patent Document 1). Patent Document 1: Japanese Unexamined Patent Publication (Kokai) No. 2001-94164

DISCLOSURE OF THE INVENTION

Problems to be Solved by the Invention

However, there have recently been demands for further improvement in durability of the element that is required to be operable continuously under higher voltage and higher pressure over a long period of time.

Thus, an object of the present invention is to provide a multi-layer piezoelectric element that has high durability with capability to operable continuously under higher voltage and higher pressure over a long period of time, a method for manufacturing the same, an injection apparatus and a fuel injection system.

Means for Solving the Problems

The multi-layer piezoelectric element of the present invention comprises a multi-layer structure that has a plurality of internal electrode layers and a plurality of piezoelectric ceramic layers and has a driving portion formed by stacking the internal electrode layers and the piezoelectric ceramic layers alternately on each other and non-driving portions that are formed by stacking a plurality of the piezoelectric ceramic layers and are disposed on both ends of the driving portion in the stacked direction, wherein the piezoelectric ceramic layers of the non-driving portions include the same piezoelectric material as that of the piezoelectric ceramic layers of the driving portion as a main component and have a mean crystal grain size larger than that of the driving portion.

Effects of the Invention

According to the multi-layer piezoelectric element of the present invention, it is possible to exert the effect capable of reducing the stress generated around the interface between the opposing portion and the non-opposing portions.

DESCRIPTION OF REFERENCE NUMERALS

Figure 1:
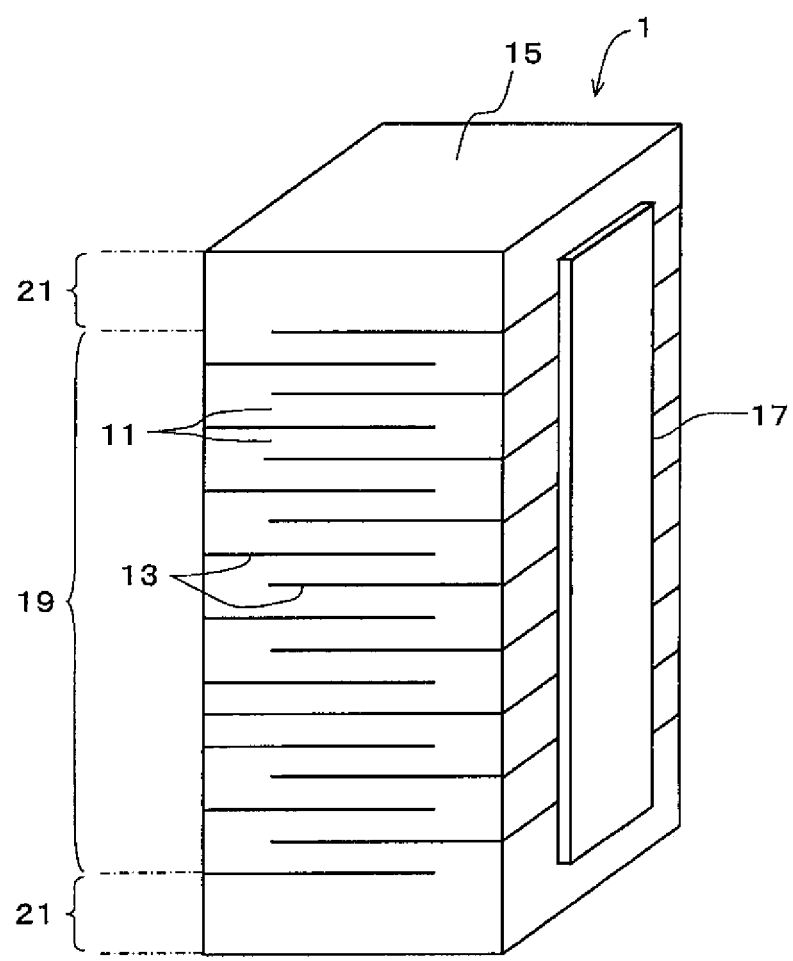
FIG. 1 is a perspective view showing a multi-layer piezoelectric element according to one embodiment of the present invention.

11: Piezoelectric material ceramic layer
13: Internal electrode layer
15: Multi-layer structure
17: External electrode
19: Opposing portion
21: Non-opposing portions

BEST MODE FOR CARRYING OUT THE INVENTION

Multi-Layer Piezoelectric Element

The multi-layer piezoelectric element according to one embodiment of the present invention will be described in detail below with reference to the accompanying drawings.

FIG. 1 is a perspective view of the multi-layer piezoelectric element according to this embodiment. The multi-layer piezoelectric element 1 has a multi-layer structure 15 formed by stacking piezoelectric material layers 11 and internal electrode layers 13 alternately one on another. The multi-layer structure 15 has a pair of external electrodes 17 formed on the side face thereof. The multi-layer structure 15 has an opposing portion 19 where the internal electrode layers 13 oppose each other and non-opposing portions 21 positioned on both end portions of the opposing portion 19 in the stacked direction.

The opposing portion 19 is a driving portion where the piezoelectric ceramic layer 11 sandwiched between the internal electrode layers 13 that adjoin and oppose each other undergoes expansion and contraction in response to the voltage applied between the internal electrode layers 13 positioned on both sides thereof, so as to change the dimension of the element 1 in the stacked direction.

In contrast, the non-opposing portions 21 are non-driving portions that are not provided with the internal electrode layers 13 that sandwich the piezoelectric material layer and are subjected to the voltage, and therefore does not undergo displacement.

Therefore, in this embodiment, the non-opposing portions 21 are formed to have lower rigidity so that the non-opposing portions 21 do not restrict the opposing portion 19 from expanding and contracting and to reduce the stress generated in the interface thereof with the opposing portion 19.

Specifically, in the element 1 of this embodiment, the non-opposing portions 21 are formed by using the same piezoelectric ceramics as that of the opposing portion 19, and has mean crystal grain size of the piezoelectric ceramics larger than that of the opposing portion 19. This makes it possible to reduce the stress generated in a region near the interface between the opposing portion 19 and the non-opposing portions 21. This is because rigidity becomes lower as the particle size of the piezoelectric ceramics becomes larger. When the non-opposing portions 21 that do not undergo displacement when subjected to a voltage is formed to have a low rigidity, strain between the opposing portion 19 and the non-opposing portion 21 can be absorbed by the non-opposing portions 21. Lower rigidity of the non-opposing portions 21 also decreases the force that restricts the deformation caused by the action of the opposing portion 19.

Mean crystal grain size of the piezoelectric ceramics in the non-opposing portions 21 is preferably 1.3 times or more, and more preferably 1.5 times or more as large as the mean crystal grain size of the piezoelectric ceramics in the opposing portion 19. This makes it possible for the strain generated during operation to be absorbed effectively in the non-opposing portions 21. For example, in case mean crystal grain size of the piezoelectric ceramics in the opposing portion 19 is from about 1 to 3 µm, mean crystal grain size of the piezoelectric ceramics in the non-opposing portions 21 is preferably from about 3 to 6 µm, and more preferably roughly from 4 to 5 µm. The mean crystal grain size of the piezoelectric ceramics can be measured as follows. First, the opposing portion 19 and the non-opposing portions 21 are exposed by using a known polishing method. Then these exposed surfaces are observed under, for example, a scanning electron microscope (SEM) and a line segment of a predetermined length is drawn over the image. The number of crystal grains lying on the line segment is counted, and the length of the line segment divided by the number of crystal grains is taken as the mean crystal grain size.

The mean crystal grain size of the piezoelectric ceramic layers 11 in the non-opposing portions 21 can be made larger than the mean crystal grain size of the opposing portion 19 by, for example, adding an alkaline metal to the piezoelectric ceramic layers 11 of the non-opposing portions 21, as will be described hereinafter.

The stress generated in a region near the interface between the opposing portion 19 and the non-opposing portions 21 can be mitigated further by making the content of the alkaline metal in the non-opposing portions 21 higher than that in the opposing portion 19. Presence of the alkaline metal increases the dielectric loss in the piezoelectric material located nearby. Therefore, displacement in a region near the interface between the opposing portion 19 and the non-opposing portions 21 can be decreased by making the content of the alkaline metal in the non-opposing portions 21 higher than the content of the alkaline metal in the opposing portion 19. This makes it possible to more effectively reduce the stress generated in a region near the interface between the opposing portion 19 and the non-opposing portions 21.

In case PZT powder is used as the main component, for example, content of the alkaline metal in the non-opposing portions 21 is from about 0.01% by weight to 0.5% by weight, and preferably from about 0.1% by weight to 0.3% by weight. While the content of the alkaline metal in the opposing portion 19 may be a little lower than that of the non-opposing portions 21, it is preferably 0.01% by weight or less. The content of the alkaline metal in the non-opposing portions 21 is preferably twice or more, and more preferably three times or more of the content of the alkaline metal in the opposing portion 19. The content of alkaline metal may be measured as follows. Cut off and crush a desired portion to measure, and carry out ICP (inductively coupled plasma) analysis.

The method for manufacturing an element 1 according to this embodiment will be described below. The method for manufacturing an element 1 is the method for the multi-layer piezoelectric element that includes a stacking step of forming the multi-layer structure. The stacking step comprises a first stacking step in which a green compact of the driving portion is formed by stacking first piezoelectric green sheets and metal paste layers alternately one on another, and a second stacking step in which a stack of the non-driving portions is formed by stacking a plurality of second piezoelectric green sheets that include an alkaline metal with higher concentration than the first piezoelectric green sheets does on both end portions of the green compact of the driving portion in a stacked direction. First, a powder of lead titanate zirconate (PZT), a binder made of an organic polymer such as an acrylic or butyral resin and a plasticizer such as DBP (dibutyl phthalate) or DOP (dioctyl phthalate) are mixed to form a slurry. The slurry is formed into a ceramic green sheet (piezoelectric green sheets) by a doctor blade method or a calendar roll method, or other tape molding method.

More alkaline metal is added to the slurry for the non-opposing portions 21 that would form the second piezoelectric green sheets than in the slurry for the opposing portion 19 that would form the first piezoelectric green sheets, so that the opposing portion 19 and the non-opposing portion 21 include the alkaline metal contents described above after being fired. Thus mean crystal grain size of the piezoelectric ceramics in the non-opposing portions 21 that has been fired can be made larger than the mean crystal grain size of the piezoelectric ceramics in the opposing portion 19 that has been fired. Since the alkaline metal accelerates the sintering step, crystal grain size is made larger when the content of alkaline metal is higher, under the same firing conditions. It is not necessary to add the alkaline metal to the slurry of the opposing portion 19.

Then a metallic paste for forming the internal electrode layers 13 is prepared. The metallic paste is prepared by mixing a metal powder consisting mainly of silver-palladium with a binder and a plasticizer. The metallic paste is applied to one side of the ceramic green sheet in the shape of the internal electrode layers 13 by screen printing or the like.

Then the ceramic green sheets having the metallic paste printed thereon are stacked as shown in FIG. 1, and are dried to make a multi-layer green compact. The ceramic green sheets for the opposing portion 19 without the metallic paste printed thereon are stacked in plurality on both ends in the stacked direction of the multi-layer green compact. The multi-layer green compact may be cut into a desired form as required.

Then, the multi-layer green compact is heated to a predetermined temperature to remove the binder, before being fired at a temperature from 900 to 1,150° C., thereby to obtain the multi-layer structure 15. As required, the side of the multi-layer structure 15 may be polished.

Then the external electrodes 17 are formed on the side face of the multi-layer structure 15. The external electrodes 17 are formed from a metallic paste that is prepared by mixing a metal powder consisting mainly of silver with a binder, a plasticizer, glass powder and the like, by applying the metallic paste to the side face of the multi-layer structure 15 by screen printing and firing at a temperature from 600 to 800° C.

An electrical conductivity assisting member may be formed from an electrically conductive adhesive, including a metal mesh or a mesh-like metal sheet embedded therein, and provided on the external surface of the external electrode 17. The metal mesh refers to a structure of entwined metal wires, and the mesh-like metal sheet refers to a metal sheet with a number of holes punched therethrough.

Then with lead wires connected to the external electrodes 17 by soldering or the like, the side faces of the multi-layer structure 15 including the external electrodes 17 are coated with a covering resin such as silicone rubber by a technique such as dipping or the like, thereby to obtain the multi-layer piezoelectric element 1.

In the multi-layer piezoelectric element 1 of the embodiment described above, it is made possible to effectively mitigate the stress generated in a region near the interface between the opposing portion 19 and the non-opposing portions 21 by setting the content of an alkaline metal in the non-opposing portions 21 higher than that in the slurry for the opposing portion 19 after firing, and making the mean crystal grain size of the piezoelectric ceramics in the non-opposing portions 21 larger than the mean crystal grain size of the piezoelectric ceramics in the opposing portion 19.

However, the present invention is not limited to the embodiment described. For example, the mean crystal grain size of the piezoelectric ceramics in the non-opposing portions 21 may be made larger without using alkaline metal.

The method for making the mean crystal grain size of the piezoelectric ceramics in the non-opposing portions 21 larger without using alkaline metal includes, for example, such a method as the mean crystal grain size of a powder such as lead titanate zirconate (PZT) contained in the slurry for the non-opposing portions 21 of the second piezoelectric green sheets is made larger than the mean crystal grain size of a powder such as lead titanate zirconate (PZT) contained in the slurry for the opposing portion 19 of the first piezoelectric green sheets.

<Injection Apparatus>

Figure 2:
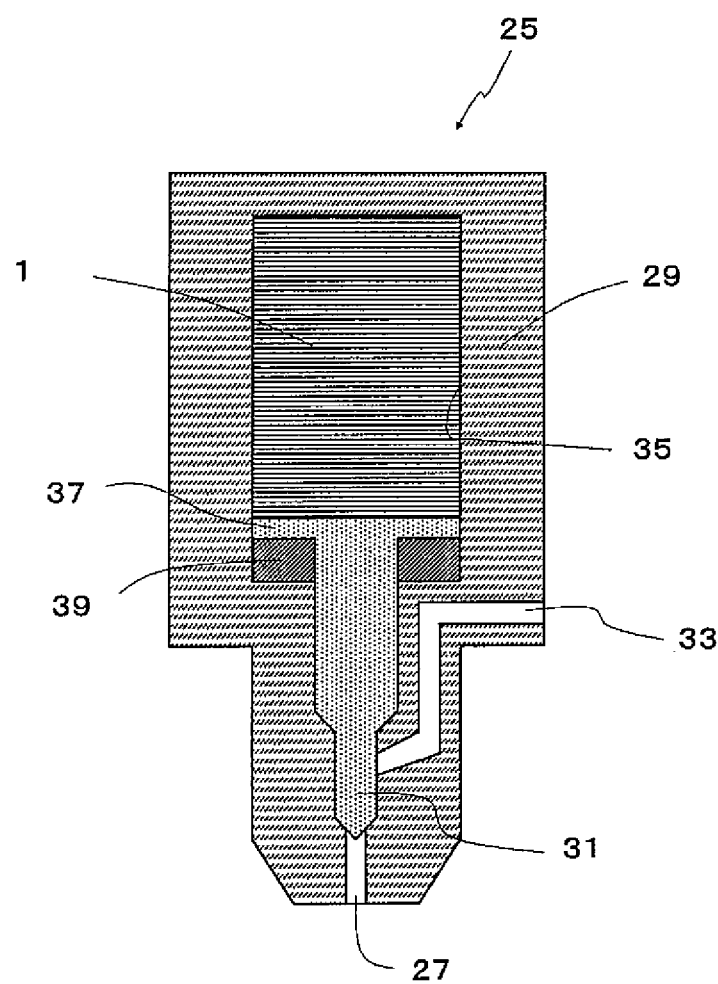
FIG. 2 is a schematic diagram showing an injection apparatus according to one embodiment of the present invention.

FIG. 2 is a schematic diagram showing an injection apparatus according one embodiment of the present invention. As shown in FIG. 2, the injection apparatus 25 of this embodiment has the multi-layer piezoelectric element 1 of the present invention represented by the embodiment described above accommodated in a container 29 that has an injection orifice 27 formed at one end thereof. The container 29 includes a needle valve 31 that can open and close the injection orifice 27 disposed therein. Connected to the injection orifice 27 is a fuel passage 33 that is capable of communicating therewith in response to the action of the needle valve 31. The fuel passage 33 is connected to a fuel source provided on the outside, so that a fuel is supplied through the fuel passage 33 at a constant pressure that is always high. Accordingly, when the needle valve 31 opens the injection orifice 27, the fuel supplied to the fuel passage 33 is injected at a high constant pressure into a fuel chamber of an internal combustion engine which is not shown.

The needle valve 31 is enlarged in inner diameter at the upper end, and is provided with a piston 37 capable of sliding in a cylinder 35 that is formed in the container 29. A piezoelectric actuator having the multi-layer piezoelectric element 1 described above is accommodated in the container 29.

With the injection apparatus 25 as described above, when the piezoelectric actuator is caused to expand by applying a voltage thereto, piston 37 is pressed so that the needle valve 31 plugs the injection orifice 27 and shuts off the fuel supply. When the voltage is removed, the piezoelectric actuator contracts and a Belleville spring 39 presses back the upper end of the piston 37 so that the injection orifice 27 communicates with the fuel passage 33 thereby allowing the fuel to be ejected.

The injection apparatus 25 of the present embodiment may also be constituted from a container that has the injection orifice 27 and the multi-layer piezoelectric element 1 described above, so that a liquid filling the container is discharged through the injection orifice 27 by an operation of the multi-layer piezoelectric element 1. That is, the multi-layer piezoelectric element 1 may not necessarily be in the inside of the container. The only requirement is that a pressure can be applied to the inside of the container by the operation of the multi-layer piezoelectric element 1. In the present invention, the liquid may be a fuel, ink or various other fluid (such as electrically conductive paste).

<Fuel Injection System>

Figure 3:
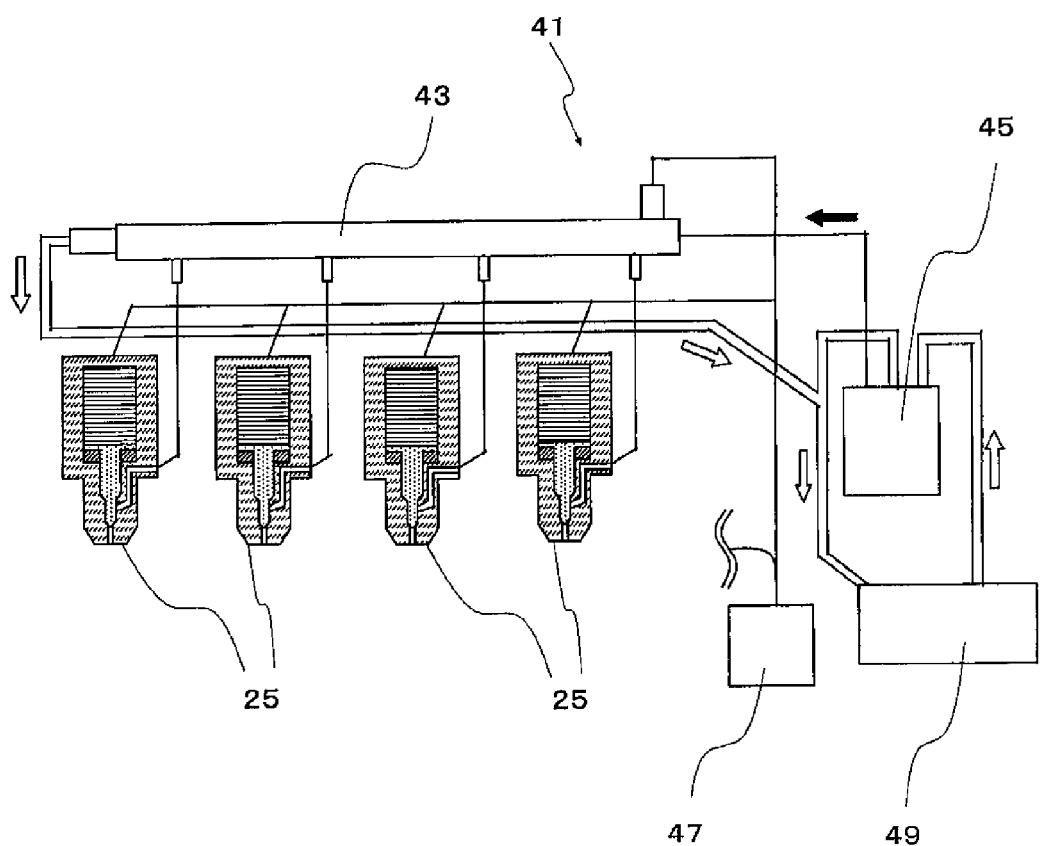
FIG. 3 is a schematic diagram showing a fuel injection system according to one embodiment of the present invention.

FIG. 3 is a schematic diagram showing a fuel injection system according to one embodiment of the present invention. As shown in FIG. 3, the fuel injection system 41 of this embodiment comprises a common rail 43 that stores a high-pressure fuel, a plurality of the injection apparatuses 25 that eject the fuel stored in the common rail 43, a pump 45 that supplies the fuel at a high pressure to the common rail 43 and an injection control unit 47 that sends a drive signal to the injection apparatuses 25.

The injection control unit 47 controls the quantity and timing of fuel injection while monitoring the condition in the combustion chamber of an engine with sensors and the like. The pump 45 delivers the fuel from the fuel tank 49 to the common rail 43 by boosting the pressure to a level in a range from 1000 to 2,000 atm (from about 101 MPa to about 203 MPa), preferably from 1,500 to 1,700 atm (from about 152 MPa to about 172 MPa). The common rail 43 stores the fuel that has been supplied by the pump 45, and sends it to the injection apparatuses 25 as required. The injection apparatus 25 injects a small amount of the fuel through the injection orifice 27 in the form of mist into the combustion chamber.

While the embodiments of the present invention have been described, the present invention is not limited to the embodiment described above. The non-opposing portions 21 in the present invention are portions where the internal electrode layers 13, that contribute to the displacement when a voltage is applied, are not provided to oppose each other, namely the portion that does not undergo displacement. Accordingly, the non-opposing portions may include metal layer or the like.

The invention claimed is:

1. A multi-layer piezoelectric element, comprising:
   a multi-layer structure comprising a plurality of internal electrode layers and a plurality of piezoelectric ceramic layers,
   wherein the multi-layer structure comprises a driving portion formed by stacking the plurality of internal electrode layers and the piezoelectric ceramic layers alternately on each other, and non-driving portions that are formed by stacking a plurality of the piezoelectric ceramic layers and are disposed on both end portions of the driving portion in a stacked direction, and
   wherein the piezoelectric ceramic layers of the non-driving portions comprise the same piezoelectric material as that of the piezoelectric ceramic layers of the driving portion as a main component, and have a mean crystal grain size larger than that of the driving portion, and have a content of an alkaline metal higher than that of the driving portion.

2. A injection apparatus, comprising:
   a container comprising an injection orifice; and
   the multi-layer piezoelectric element according to claim 1, wherein a liquid filling the container is discharged through the injection orifice by an operation of the multi-layer piezoelectric element.

3. A fuel injection system, comprising:

a common rail configured to store a high-pressure fuel;

the injection apparatus according to claim 2 which is configured to eject the high-pressure fuel stored in the common rail;

a pump configured to supply the high-pressure fuel to the common rail; and an injection control unit configured to send a drive signal to the injection apparatus.

4. A multi-layer piezoelectric element, comprising:

a multi-layer structure comprising a plurality of internal electrode layers and a plurality of piezoelectric ceramic layers, wherein the multi-layer structure comprises a driving portion formed by stacking the plurality of internal electrode layers and the plurality of piezoelectric ceramic layers alternately on each other, and non-driving portions that are formed by stacking a plurality of the piezoelectric ceramic layers and are disposed on both end portions of the driving portion in a stacked direction, and wherein the piezoelectric ceramic layers of the non-driving portions comprise the same piezoelectric material as that of the driving portion as a main component, and have a content of an alkaline metal higher than that of the driving portion.

* * * * *